United States Patent [19]
David et al.

[11] Patent Number: 5,890,920
[45] Date of Patent: *Apr. 6, 1999

[54] CARD SECURITY MECHANISM FOR A MEMORY CARD CONNECTOR AND METHOD OF USE

[75] Inventors: James J. David, Mechanicsburg; Scott S. Duesterhoeft, Etters; John M. Spickler, Marietta, all of Pa.; Naoki Hiyama, Yokohama, Japan

[73] Assignee: Berg Technology, Inc., Reno, Nev.

[*] Notice: The term of this patent shall not extend beyond the expiration date of Pat. Nos. 5,564,936 and 5,573,413.

[21] Appl. No.: 919,434

[22] Filed: Aug. 27, 1997

Related U.S. Application Data

[63] Continuation of Ser. No. 731,436, Oct. 15, 1996, abandoned, which is a continuation of Ser. No. 349,186, Dec. 7, 1995, Pat. No. 5,564,936.

[51] Int. Cl.$^6$ .................................................. H01R 13/62
[52] U.S. Cl. .......................................... 439/159; 439/157
[58] Field of Search ..................................... 439/152–160

[56] References Cited

U.S. PATENT DOCUMENTS

| | | | |
|---|---|---|---|
| 5,033,972 | 7/1991 | Komatsu | 439/153 |
| 5,564,936 | 10/1996 | David et al. | 439/159 |
| 5,573,413 | 11/1996 | David et al. | 439/159 |

*Primary Examiner*—Steven L. Stephan
*Assistant Examiner*—Brian J. Biggi
*Attorney, Agent, or Firm*—Daniel J. Long; M. Richard Page

[57] ABSTRACT

Disclosed is a closure device which projects from the side elements of the frame of a memory card connector to provide security for the memory card. The activation of the closure means is coordinated with the movement of the card eject plate so that after the card is inserted the connector cannot readily be tampered with to remove the card.

20 Claims, 6 Drawing Sheets

CARD SECURITY MECHANISM FOR A MEMORY CARD CONNECTOR AND METHOD OF USE

This application is a continuation of application Ser. No. 08/731,436, filed Oct. 15, 1996, abandoned, which is a continuation of application Ser. No. 08/349,186, filed Dec. 7, 1995, now U.S. Pat. No. 5,564,936.

CROSS REFERENCE TO RELATED APPLICATIONS

This application is related to Ser. No. 08/608,979, filed Feb. 29, 1996, now U.S. Pat. No. 5,597,316 which is a continuation of application Ser. No. 08/348,734, filed Dec. 7, 1994, abandoned, entitled "Memory Card Connector Having Improved Eject Mechanism and Method of Use" and application Ser. No. 08/349,185 filed Dec. 7, 1994, now U.S. Pat. No. 5,573,413, entitled "Eject Activation Mechanism for a Memory Card Connector and Method of Use".

BACKGROUND OF INVENTION

1. Field of the Invention

The present invention relates to electrical connectors and in particular to connectors for memory cards.

2. Brief Description of Prior Developments

Memory cards and other card-like electronic media are conventionally ejected from computer systems by means of a mechanical linkage between an actuator bar which is connected to a link arm which moves a eject plate against the card. Such systems have disadvantages in that various users may exert inadequate force on the actuator bar to eject the card by a distance of about 4 mm at which it can be easily recovered manually. In any case, the amount of force applied will often vary from individual to individual so that the distance which the card is ejected beyond the frame may be expected to be generally disuniform. Further such mechanical systems may result in a card being ejected while the computer system is still accessing it. Additionally, certain memory cards may contain sensitive information, and such manual ejection systems provide little or no security for such cards.

There is, therefore, a need for an eject system which is adapted to being activated by a computer system, or alternatively, by manual control of an electrical current activated device. There is also a need for a system which maximizes the force available for ejectment of the memory card and which at the same time permits easy insertion of the memory card. Further, there is a need for a system which is capable of providing security for the memory card.

SUMMARY OF THE INVENTION

The connector apparatus of the present invention is readily adaptable to automatic ejection and providing security for the memory card. In this apparatus the card may be inserted with little resistive force while at the same time ejecting force is maximized by means of a mechanical advantage. This advantage is obtained by an adaptation of the link arm and eject plate connection in which the eject plate bears on the link arm at a first contact position during insertion. During ejectment a second separate contact position is engaged. The distance between the first contact position used during insertion and the pivot point of the link arm is greater than the distance between the second contact position and the link arm by a factor of between 3:1 to 6:1. A significant mechanical advantage is therefore realized.

Another feature of the connector apparatus of this invention is a trigger device for release of the restrained link arm. In this device a longitudinally directed force, which may result, for example, from the activation of an electrical current through a circuit which includes a wire which varies dimensionally depending on current load, is applied to a rotational force transfer device. That rotational device is moved by that wire to withdraw a pin from the link arm so that the link arm moves out of its restrained position in response to a longitudinal force provided by a spring.

Another feature of this connector is a closure means which projects from the side elements of the frame to provide security for the memory card. The activation of the closure means is coordinated with the movement of the eject plate so that after the card is inserted, the connector cannot readily be tampered with to remove the card.

This connector many be used with any type of card-like electronic medium which includes, without limitation, memory cards such as any type I, type II or type III PCMCIA cards as well as any other card which may be used in any type of computer system to perform a similar function.

BRIEF DESCRIPTION OF THE DRAWINGS

The invention is further described with reference to the accompanying drawings in which.

DETAILED DESCRIPTION OF THE PREFERRED EMBODIMENTS

Figure 1:
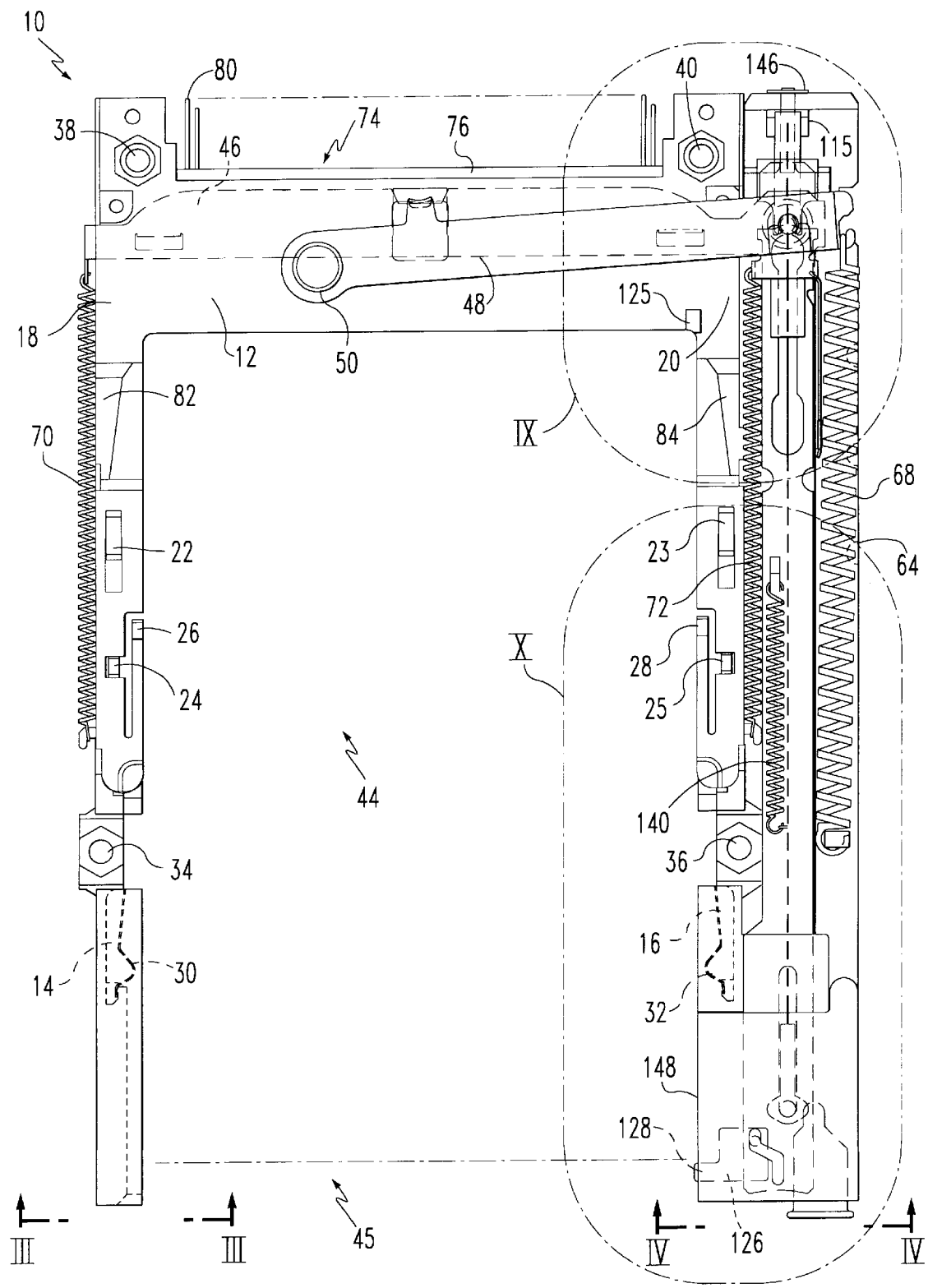
FIG. 1 is a top plan view of the connector apparatus of the present invention.
Figure 2:
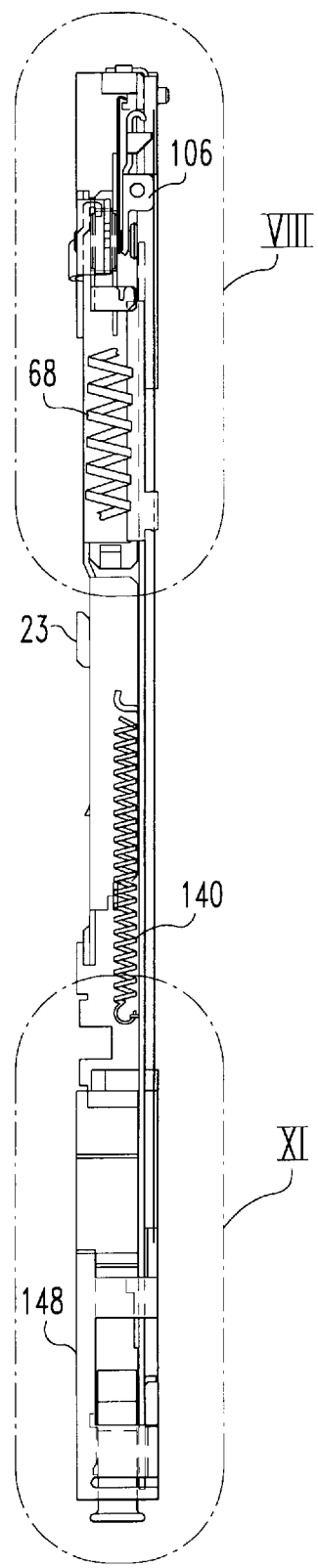
FIG. 2 is a side elevational view of the connector apparatus shown in FIG. 1.
Figure 3:
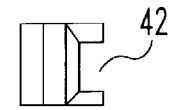
FIG. 3. is a front elevational view taken from line III—III of the connector apparatus shown in FIG. 1.
Figure 4:
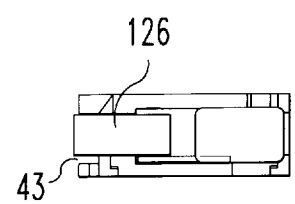
FIG. 4 is a front elevational view taken from line IV—IV of the connector apparatus shown in FIG. 1.

Referring to FIGS. 1 through 4, the memory card connector of the present invention includes a frame member shown generally at numeral 10. This frame member is made up of a metallic rear transverse element 12 and two plastic longitudinal elements 14 and 16. The rear transverse element has metal extensions 18 and 20 which extend perpendicularly therefrom to be connected to the longitudinal elements by means of clips respectively at 22 and 23 and latches 24 and 25. On the longitudinal elements 14 and 16 there are also ESD contacts respectively at 26 and 28 and EMI contacts respectively at 30 and 32. There are also front apertures respectively at 34 and 36 through these two longitudinal elements which with rear apertures 38 and 40 in the header will be used to connect the assembly to a printed wiring board. There are also side grooves 42 and 43 (FIGS. 3 and 4) in the two longitudinal elements which serve to retain the memory card between those elements in a storage space generally at numeral 44. One end of the frame is open to define an insertion inlet shown generally at numeral 45. Referring particularly to FIG. 1, it will be seen that there is also a card eject plate 46 immediately beneath the rear transverse element of the frame. A link arm 48 is connected at pivot point 50 to the rear transverse element of the frame member and the card eject plate is positioned immediately beneath that rear transverse element. It will be observed that the link arm pivots in a horizontal arc parallel to the plane of the eject plate.

Figure 6:
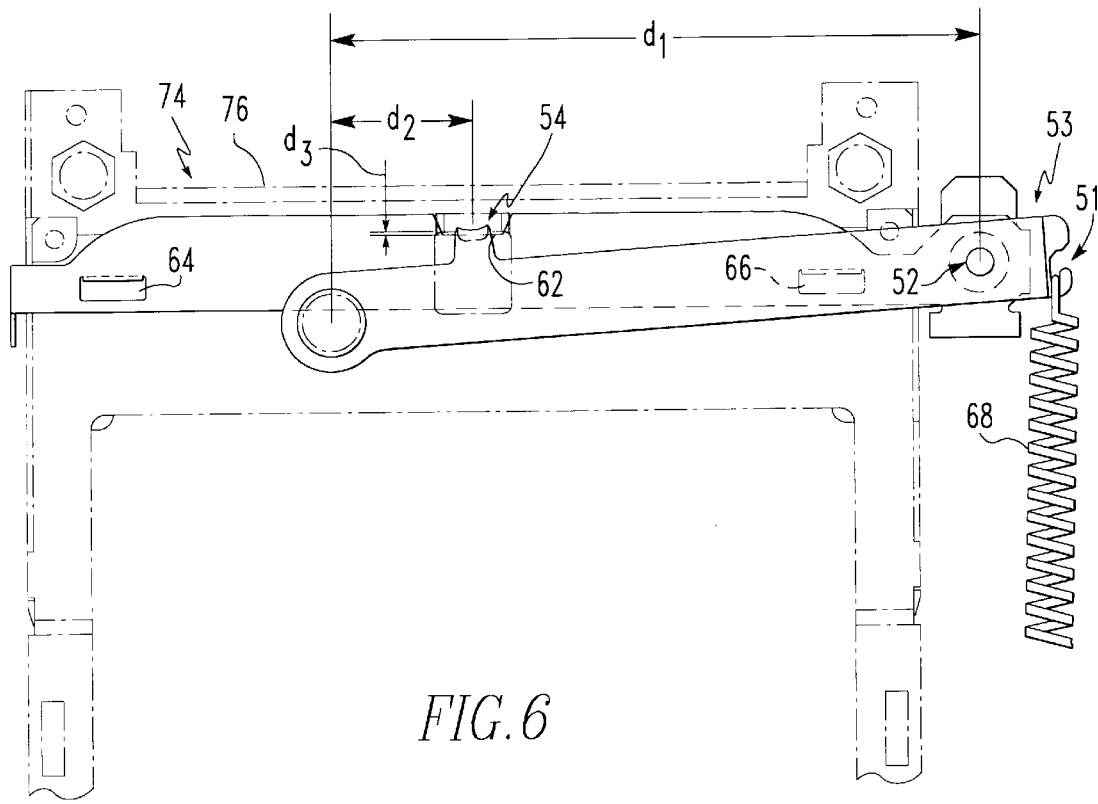
FIG. 6 is a schematic view showing the relative orientation of the link arm and the eject plate in a position where a memory card is fully engaged.

Referring particularly to FIG. 6, it will be seen that when a memory card is inserted, the eject plate will be pushed rearwardly to a rear position shown generally at numeral 51 and will engage the link arm at a first contact point shown generally at numeral 52 which is adjacent the terminal end of the link arm which is shown generally at numeral 53. This first contact point is formed by a pin and bushing arrangement in which the link arm is attached to the eject plate as is disclosed in greater detail below in connection with FIGS. 7 and 8. It will be noted that there is a distance $d_1$ from this first contact point to the pivot point of the link arm. It will also be see that when the memory card is being ejected, the link arm will engage the eject plate at a second contact point shown generally at numeral 54. It will be noted that there is a distance $d_2$ from this second contact point to the pivot point of the link arm. Preferably the ratio of $d_1:d_2$ will be 3:1 to 6:1. The link arm has a lateral extension 56 from which push tab 58 extends. There is a central aperture 60 in the rear transverse element through which the push tab projection 58 extends downwardly to engage recessed surface 62 on the card eject plate. It will be noted that there is a distance $d_3$ between the projection 58 on the link arm and recessed surface 62 on the eject plate. On the eject plate there are card engagement projections 64 and 66. There is also a longitudinal link arm spring 68 and longitudinal eject plate springs 70 and 72 which tend to pull those elements forward but are restrained as is explained hereafter. The connector header is shown generally at numeral 74 and includes a transverse bar 76, front pins as at 78, rear pins as at 80 and opposed side legs 82 and 84.

Figure 5:
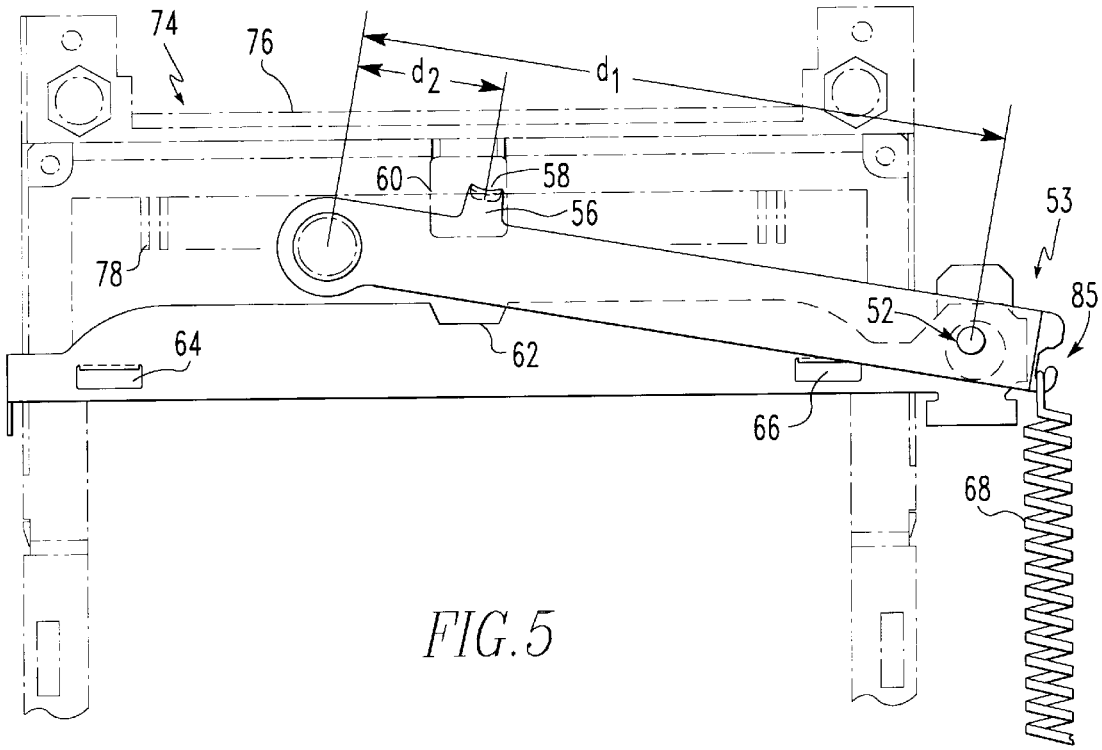
FIG. 5 is a schematic view showing the relation of the link arm and the eject plate elements of the connector apparatus of the present invention prior to the memory card being fully engaged.

Referring particularly to FIG. 5 showing the open position in which a card is not fully inserted and the link arm is in a forward position shown generally at 85, it will be appreciated that the force that is required to load up the spring that is attached to the link arm is relatively low due to the advantage that results from the force being applied a good distance from the pivot point of the link arm versus near the link arm pivot point. This low insertion force is desirable until the card is fully inserted into the mechanism and the mechanism is locked. Once the mechanism is locked it is then desirable, when ejecting the card from the header, to transfer the mechanical advantage from the end of the link arm to the push tab of the link arm. In other words, what is accomplished is that the contact point, or the application point of the card ejection force, is at a point near the pivot point rather than near the end of the link arm. Referring again particularly to FIG. 6 showing the relative position of the link arm and eject plate when the card is fully inserted and the mechanism is locked and ready to eject the card, it will be noted that the gap between the push tab of the link arm and the eject plate has been maintained from when the card was first inserted into the mechanism until the mechanism is latched. At this point no transfer of the mechanical advantage has taken place. The eject plate is released before the link arm but it does not move since it abuts the card and the springs that are attached to the eject plate are not strong enough to disengage the card from the header pin field. Therefore, until the link arm is released, the eject plate is essentially stationary even if it has been released. The angular displacement of the link arm between its forward and rearward position (and between the rear transverse member of the frame and the forward positioned of the link arm) is preferably from 5° to 20°. Once the link arm is released it is driven toward the eject plate via the spring on the end of the link arm and the gap between the push tabs on the link arm and the recessed surface on the eject plate immediately disappears and the force supplied by the spring on the end of the link arm is transferred to the push tab on the link arm. This push tab further transfers the force to the eject plate. Since this point of force application is fairly close to the link arm pivot point, there is a high mechanical advantage. This advantage generates enough force to overcome the total disengaging forces required to drive the card off the header pin field. The high level of force generated by the link arm is only required for a short period of time, e.g. just enough to get the card disengaged. The throw of the link arm is, therefore, required only for a short distance. If this high level of force were to be continued it might not only drive the card off of the pin field but completely out of the entire mechanism, which is not a desirable situation. Hence the reason for the short throw of the link arm. Once the throw of the link arm is complete, the card is essentially free and further movement through the storage space is accomplished by overcoming the frictional forces on the card moving along the side grooves of the longitudinal elements. This movement is the function of the springs that are attached to the eject plate. Once the link arm throw is complete, these springs take over and continue to push the card out through the storage area in a controlled manner. The result is that the back portion of the card is ejected completely out of the insertion inlet area such that it is easily retrieved by human hands but not so far as to have the card fall out of the mechanism.

Figure 7:
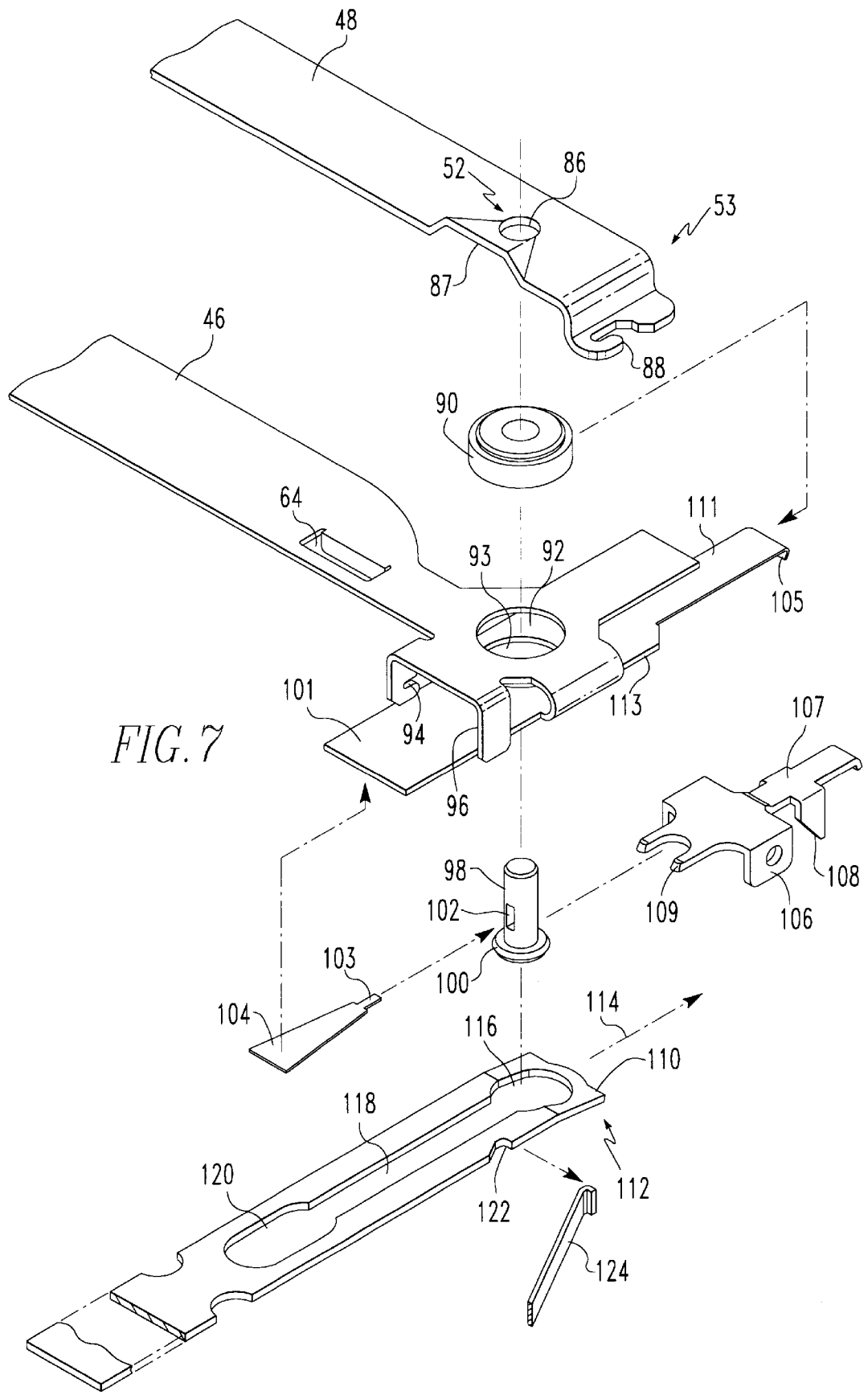
FIG. 7 is a exploded schematic view of elements of the trigger mechanism of the connector apparatus of the present invention.
Figure 8:
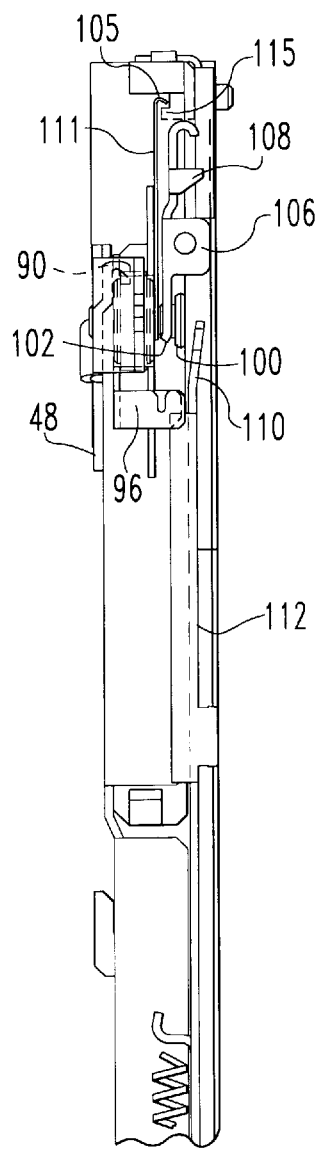
FIG. 8 is an enlarged view of the area within area VIII in FIG. 2.

Referring to FIGS. 7 and 8, the locking and trigger mechanism is shown in greater detail. It will be seen that the link arm 48 has an aperture 86 positioned above a pin lead-in recess 87 and a hook 88 for engaging the longitudinal link arm spring (not shown in FIGS. 7 and 8). The link arm is superimposed over a bushing 90 which engages apertures 92 and 93 in the eject plate. The eject plate is also equipped with a hook 94 for engaging its longitudinal spring (not shown in FIGS. 7 and 8) and a timing bar release arm 96 the function of which is described hereafter. A plunger pin 98 having a head 100 of a larger diameter than its shaft and an aperture 102 engages the bushing 90 and the aperture 86 in the link arm. This plunger pin is itself engaged in its aperture 102 by the biasing spring nose 103 on biasing spring 104. The biasing spring is welded at its opposite end to projection 101 on the eject plate. Rocker arm 106 has a rear safety lock engagement arm 107 and dual forward extensions as at 109 that rotate downwardly to engage the head of the plunger pin in response to rearward longitudinal pressure being applied at the contact point 108 by a contact point as at 110 on timing bar 112. The rearward longitudinal pressure is applied to the timing bar by memory wire 114. Simultaneously, the pressure applied at contact point 108 on the rocker arm transmits a force to cause the rear safety latch engagement arm 107 to rotate against the safety latch 111. The force imparted on the safety latch arm disengages latch 105 from a ledge 115 (FIG. 8) on longitudinal element 16 of the frame. The rocker arm biasing surface 113 on the eject plate is used during card insertion and is explained hereafter. When the timing bar is pulled in a rearward longitudinal direction by memory wire 114, it will be appreciated that the head of the plunger pin will pass through rear aperture 116 in the timing bar. By the term "memory wire" what is meant is a wire formed from an alloy or other material that exhibits the characteristic of changing longitudinal dimension in response to being energized with an electrical current. A suitable memory wire material is available from Dynalloy, Inc. located at 18662 MacArthur Boulevard, Suite #103, Irvine, Calif. 92715 under the trademark FLEXINOL. This aperture 116 connects to a slot 118 which has a width less than the diameter of the plunger pin head. The slot connects also to a forward aperture 120 which has a width which is also greater than that of the head of the plunger pin. In operation, when the memory wire is energized with an electrical current it will exert force in a rearward direction on the timing bar which will itself exert force on the rocker arm to rotate it downwardly against the head of the plunger pin and through the rear aperture in the timing bar. Being disengaged from the bushing and the eject plate, the link arm pivots in a forward direction to engage the eject plate at its second contact point. The force exerted at this point in addition to the longitudinal force exerted by the eject plate spring 70 and 72 (FIG. 1) causes the eject plate to eject any card positioned in the storage space. A locking surface 122 on the timing bar is engaged by a timing bar lock 124 to retain the timing bar in a rearward position as is more fully explained hereafter. The link arm moves forward until it is stopped by link arm stop 125 (FIGS. 1 and 9).

Figure 11:
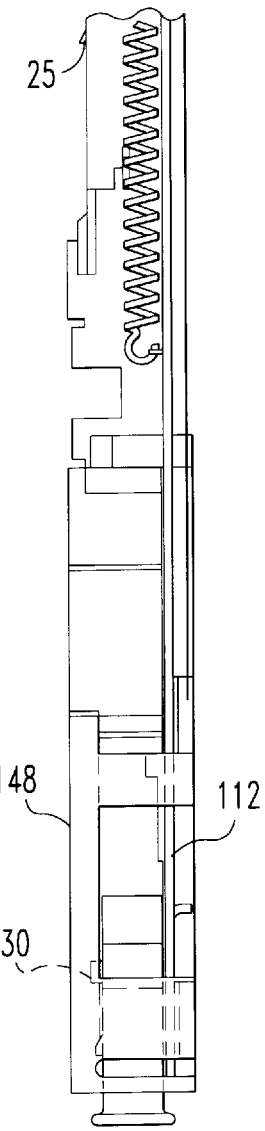
FIG. 11 is an enlarged view of the area within area XI in FIG. 2.
Figure 9:
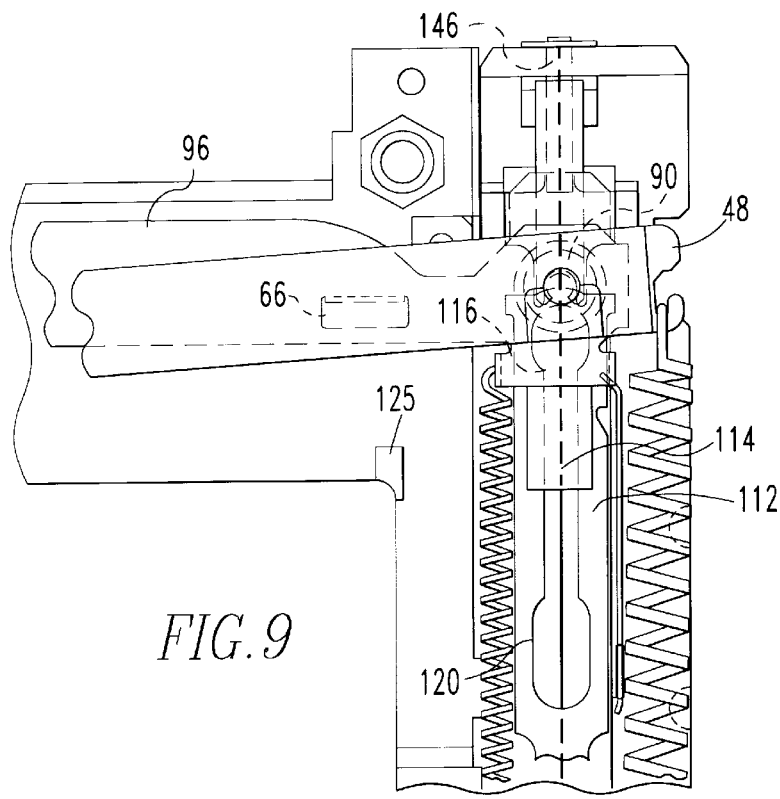
FIG. 9 are enlarged view of the area within area IX in FIG. 1.
Figure 10:
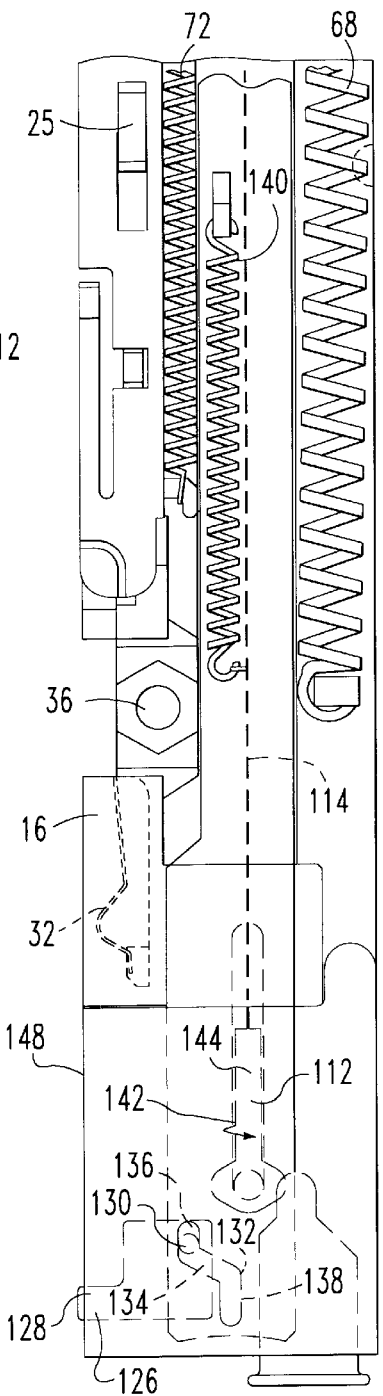
FIG. 10 is an enlarged view of the area within area X in FIG. 1.

Referring particularly to FIGS. 9 through 11, the operation of the closure mechanism is as follows. This closure mechanism includes a cam 126 which has lateral projection 128 which extends into the storage area of the connector. The cam also has a vertical projection 130 which projects through a second slot shown generally at numeral 132 in a timing bar. This slot includes a diagonal section 134 which extends outwardly and forwardly and is connected at its rear side to an upper vertical section 136 and its forward side to a lower vertical section 138. It will also be seen that the timing bar is connected to a timing bar biasing spring 140. It will be noted that there is also another slot 142 in the timing bar the function of which is to provide clearance for the memory wire terminal 144 which is crimped onto the memory wire and is fixed to the lower side of the timing bar. The memory wire runs longitudinally beneath the timing bar and is attached to another terminal 146 which is fixed to the frame. It will also be seen that the cam and related elements in the closure mechanism are housed within a plastic cover 148. In its position shown in FIGS. 9 through 11 the lateral projection of the cam extends into the storage space to prevent a memory card inserted into the storage space from being withdrawn. That is, the lateral projection extends into the storage space far enough so that it would not be easily possible for the memory card to be gripped manually and withdrawn in that manner. It will appreciated, however, that it will be necessary for this lateral projection to be withdrawn when the memory card is ejected.

The first step in the ejection cycle is the signaling of the system to deliver an electrical signal to the memory wire. It will be appreciated that a solenoid may be substituted for the memory wire. The signal will cause the timing bar to move toward the rocker arm. The contact points on the timing bar push against the contact points on the rocker arm. As the application of force is continued the rocker arm will rotate. This rotation causes the following actions: (1) the rotation will transfer the application of force to the two forward extensions on the rocker arm; (2) the rocker arm forward extensions push on the head of the plunger pin thus pulling it downwardly; and (3) the downward motion of the pin causes the release of the link arm. During the displacement cycle of the timing bar, the link arm, the eject plate and the plunger pin are also in motion. At this point the eject plate and the link arm are disengaged and can move independently of one another. Also the mechanical advantage necessary for card withdrawal has been moved from near the end of the link arm to near the pivot point. The link arm and eject plate then continue in a forward direction. The link arm's motion will be stopped by the link arm stop on the eject plate. The eject plate will have a longer eject distance than the link arm. The pin is pulled downwardly by the rocker arm and this downward motion also forces the top surface of the head of the plunger pin to fall below the bottom surface of the timing bar. The plunger pin travels with the eject plate and, at this point, the eject plate is free to move and push the card out of the slot area. The top surface of the plunger pin is under the timing bar. As the eject plate moves forward, the plunger pin will travel most of the length of the eject cycle in a retracted position, i.e. with the pin's head under the timing bar. The aperture 120 at the end of the timing bar slot 118 allows the pin to pop back up due to the movement of the plunger pin biasing spring to its original upward position. Because the pin travels in a retracted potion under the timing bar, there is no interference by the pin with the link arm during the ejection cycle. By stopping the link arm and allowing the eject plate to travel a further distance forward in the eject cycle, it will be assured that, when the pin pops back up to its original upward position, it will always be in front of the link arm. This movement ensures that the mechanism has again triggered itself. The timing bar will continue to push on the rocker arm until the electrical signal stops. Once the signal stops, there is no force being imparted to the timing bar. In this state the only force acting on the timing bar would be the timing bar biasing spring. The biasing spring urges the timing bar back to its original position in the same direction as the card ejection. Once the electrical signal is stopped and the timing bar tries to return to its original position, the timing bar lock will engage and keep the timing bar in place with the help of its biasing spring. Constant tension on the timing bar due to the biasing spring will also continue. At the end of the card ejection cycle the key components are in the following states: (1) the link arm is stopped and locked up against the stop in the cover plate; (2) the eject plate has pushed itself with the help of the secondary eject springs as far forward as possible so that its location is in front of the link arm; (3) the plunger pin is in its upper position due to its biasing spring and is in front of the link arm; and (4) the timing bar is locked in place by means of the timing bar lock.

The first element that the card will engage as it is inserted into the mechanism is the eject plate since it moves the greatest distance forward in the ejection cycle. Therefore, as the card pushes against the eject plate it will start to load up the secondary eject springs that are attached to the eject plate at which time the plunger pin, which is traveling with the eject plate, is in the up position. Continuing pressure on the card will eventually force the plunger pin into the lead-in recess 87 and then into the aperture 86 of the link arm. It will be noted that when pressure is applied to the link arm, once the pin has engaged the aperture, linkage of the link arm and eject plate will result. Since the link arm and the eject plate are linked together, and thus move in tandem with one another, this gap is maintained throughout the card insertion cycle. Because this gap is maintained, the force required to insert the card remains relatively low. The continuing card insertion loads up the primary ejection spring, but with the entire length of the link arm employed as a mechanical advantage. The card insertion will continue until the card is fully mated to the pin field in the header. Once the card is fully seated, the force to insert the card can be stopped and the card will stay in place. The amount of force that is being imparted on the card at that point by both the primary and the secondary eject springs is only as great as the force required to load up the springs. The total level of that force is not great enough to overcome the mated and frictional forces of the header and card connector contact systems; therefore, the system will remain in a static state. The movement of the mechanical advantage, from the end of the link arm to the push tab area, is required in order to generate enough force to eject the card using the primary eject spring. While the system is in a semi-stable state, some level of ejection force is imparted to the card. Furthermore, the state of the system can be changed dramatically with the introduction of vibration. In order to assure, therefore, that the system does not disengage prematurely, the safety lock 105 is employed. If, for some reason, forces are introduced to the system such that they tend to add to the card ejection forces already in place, the safety lock will engage and assure the system remains in a locked state. A number of other actions take place just before the card is fully inserted. One is that as the card nears full insertion the timing bar lock release arm on the eject plate will push on the timing bar lock, pushing it out of the way and releasing the timing bar. The timing bar biasing spring then acts on the timing bar and pulls it back to its original position This action, in turn, pushes the card lock cam out into the card slot area thus locking the card in place in the mechanism. The other action concerns the positioning and movement of the plunger pin spring and the rocker arm. Once the plunger pin moves back up to its original position, the bottom surface of the plunger pin head is now above the top surface of the timing bar. When the card nears final insertion, the rocker arm forward extensions as at 109 must be located on top of the head of the plunger pin. This position is assured due to the lead in on the front face of the extensions and the fact that the rocker arm biasing surface on the eject plate forces the rocker arm to rotate into the proper position prior to final insertion. This action will occur if the rocker arm stays in a downward position once the plunger pin has been depressed and the link arm released.

The closure mechanism is actuated by means of the timing bar and the trigger mechanism in the following manner. FIGS. 10 and 11 show the location of the cam when the card is completely inserted in the mechanism and secured. It will be noted that the vertical projection of the cam rides in the cam slot that is located in the timing bar. This slot moves the locking cam out of the way of the card when the card eject cycle is started. The card eject cycle proceeds as follows: (1) the timing bar is moved toward the rear of the mechanism by the contraction of the memory wire; (2) the approximately first two thirds of the timing bar's rearward movement is devoted strictly to moving the card locking cam at least a portion of the way out of the card slot area since the cam must be cleared before the card is ejected; and (3) the approximately final one third of the timing bar's movement releases the trigger mechanism and the link arm. Once the link arm is released, both it and the ejects plate move out toward the card exit area of the mechanism and eject the card. Both the eject plate and the link arm will stay in those locations until a card is re-inserted into the mechanism. In order to make sure that the card locking cam stays in the retracted position so as not to prevent future card insertion, when the timing bar was moved its entire rearward distance the timing bar lock 124 will be engaged. This action prevents any movement of the timing bar back toward the front of the mechanism, thus preventing any premature movement of the card locking cam into the card slot area. The timing bar is released from the timing bar lock upon card insertion. The biasing spring that is attached to the timing bar then returns the timing bar to the front of the mechanism, thus pushing the card locking cam out into the card slot area. The release of the timing bar from the lock is located and timed such that it takes place just before the card is fully inserted. Not doing this may result in premature entry of the card locking cam into the card slot area. The vertical parts of the second timing bar slot in the timing bar prevents the cam from being displaced in the cam slot.

It will be appreciated that a memory card connector has been described which is adapted to being activated by a computer system, or alternatively, by manual control of an electrical current activated device. It will also be appreciated that this connector maximizes the force available for ejectment of the memory card and at the same time permits easy insertion of the memory card. It will be further appreciated that this connector provides an efficient means for ensuring the security of the memory card.

While the present invention has been described in connection with the preferred embodiments of the various figures, it is to be understood that other similar embodiments may be used or modifications and additions Nay be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A connector apparatus for a card-like data processing medium, said connector apparatus comprising:

(a) a frame having a rear transverse element and opposed longitudinal elements forward from said rear transverse element and spaced at an interval substantially equal to the width of said card-like data processing medium, said opposed longitudinal elements defining a storage space, one end of said frame defining an insertion inlet for inserting the card-like data processing medium into the storage space;

(b) a header positioned adjacent the rear transverse element of the frame opposite the insertion inlet;

(c) an eject plate movably mounted on the frame and operable to slide toward the header to allow engagement of the card-like date processing medium with the header and away from the header to eject the card-like data processing medium;

(d) closure means for preventing withdrawal of the card-like data processing medium from the connector apparatus; and (e) means for coordinating activation of the closure means for preventing withdrawal of the card-like data processing medium with movement of the eject plate, wherein the means for coordinating activation of the closure means is responsive to being energized with an electrical current to activate said closure means when the eject plate slides toward the header to allow engagement of the card-like data processing medium with the header.

2. The connector apparatus of claim 1 wherein the means for coordinating activation of the closure means opens said closure means when the eject plate slides away from the header to eject the card-like data processing medium.

3. The connector apparatus of claim 2 wherein a lever arm is pivotally connected to the frame at a pivot point to pivot in a horizontal arc parallel to the plane of the eject plate and is operatively connected to the eject plate to move said eject plate away from the header to eject the card-like data processing medium.

4. The connector apparatus of claim 3 wherein the closure means comprises at least one cam means projecting from at least one of the side elements of the frame and said cam means is operatively connected to the eject plate by a timing bar means.

5. The connector apparatus of claim 4 wherein there is a means for applying rearward longitudinal force on the timing bar and the exertion of rearward longitudinal force on the timing bar results in the cam means being displaced transversely from a position projection into the storage space to a position withdrawn from the storage space.

6. The connector apparatus of claim 5 wherein the means for exerting rearward longitudinal force is a memory wire.

7. The connector apparatus of claim 5 wherein the means for exerting rearward longitudinal force is a solenoid.

8. The connector apparatus of claim 5 wherein there is a diagonal slot on the timing bar means which extends outwardly and forwardly and a projection from the cam means extends through said slot such that as the timing bar is displaced rearwardly the cam means will be displaced transversely to position withdrawn from the storage space.

9. The connector apparatus of claim 8 wherein the diagonal slot has forward and rearward ends and at both its forward and rearward ends the diagonal slot is connected to longitudinal slots.

10. The connector apparatus of claim 9 wherein a forwardly directed longitudinal force is continuously applied to the timing bar means.

11. The connector apparatus of claim 10 wherein the forwardly directed longitudinal force is applied by a stored energy means.

12. The connector apparatus of claim 11 wherein the stored energy means is a spring.

13. The connector apparatus of claim 10 wherein the means for applying rearward longitudinal force exerts greater force that the forwardly directed longitudinal force.

14. The connector apparatus of claim 13 wherein the timing bar means is displaceable by the means for exerting rearward longitudinal force to a rearward position where said timing bar means is engaged by a timing bar lock.

15. The connector apparatus of claim 14 wherein the closure means are opened when the timing bar means is in the rearward position.

16. The connector apparatus of claim 15 wherein the eject plate is positioned away from the header when the closure means are open and the timing bar is locked and positioned in its rearward position.

17. The connector apparatus of claim 16 wherein the eject plate has a timing bar release means which disengages the timing bar means when the eject plate moves toward the header to allow engagement of the card-like data processing medium.

18. The connector apparatus of claim 17 wherein the timing bar means is moved from its rearward position to a forward position by the forwardly directed longitudinal force when the timing bar lock is disengaged such that the closure means moves into the card storage space.

19. In a connector apparatus for receiving a card-like data processing medium in a frame element having a rear transverse element and a pair of spaced lateral elements, a header means disposed adjacent the rear element of the frame member and means for moving a card-like data processing medium out of engagement with the header comprising an eject plate moved by a link arm connected at the frame at a pivot point wherein the improvement comprises closure means for preventing withdrawal of the card-like data processing medium from the connector apparatus and means for coordinating movement of said closure means with movement of the eject plate, wherein the means for coordinating activation of the closure means is responsive to being energized with an electrical current to activate said closure means when the eject plate slides toward the header to allow engagement of the card-like data processing medium with the header.

20. In a method of operating a connector for receiving a card-like data processing medium in a frame element having a rear transverse apparatus element and a pair of spaced lateral elements, a header means disposed adjacent the rear element of the frame member and means for moving a card-like data processing medium out of engagement with the header comprising an eject plate moved by a link arm connected at the frame at a pivot point wherein the improvement comprises the steps of providing a closure means for preventing withdrawal of the card-like data processing medium from the connector apparatus and coordinating said closure means with movement of the eject plate, wherein the means for coordinating activation of the closure means is responsive to being energized with an electrical current to activate said closure means when the eject plate slides toward the header to allow engagement of the card-like data processing medium with the header.

\* \* \* \* \*